United States Patent [19]

Vandamme

[11] 4,008,755

[45] Feb. 22, 1977

[54] LEAK INDICATING APPARATUS FOR A CLOSED COOLING SYSTEM OF AN ELECTRIC MACHINE

[75] Inventor: Detlef Vandamme, Berlin, Germany

[73] Assignee: Siemens Aktiengesellschaft, Munich, Germany

[22] Filed: Aug. 18, 1975

[21] Appl. No.: 605,537

Related U.S. Application Data

[63] Continuation-in-part of Ser. No. 431,162, Jan. 7, 1974, abandoned.

[30] Foreign Application Priority Data

Jan. 24, 1973 Germany ............................ 2303941

[52] U.S. Cl. .................... 165/11; 62/129; 310/53
[51] Int. Cl.² ........................................ H02K 9/24
[58] Field of Search ................ 340/244 R, 242; 137/386; 73/292, 40; 165/11; 62/129; 310/53

[56] References Cited

UNITED STATES PATENTS

| 3,122,668 | 2/1964 | Cuny | 310/53 |
| 3,410,102 | 11/1968 | Karsten | 62/129 |
| 3,602,294 | 8/1971 | Wanson | 165/11 |

*Primary Examiner*—William E. Wayner
*Attorney, Agent, or Firm*—Kenyon & Kenyon Reilly Carr & Chapin

[57] ABSTRACT

The invention is directed to a leak indicating apparatus for the closed cooling system of an electric machine. The elevation of the coolant level in the expansion tank of the cooling system as well as the measured average temperature of the coolant are translated into electrical signals which are compared with each other. Only when there is a deviation from the normal volume-temperature proportionality and after a time delay, is replenishing coolant supplied or an indicating device actuated.

6 Claims, 1 Drawing Figure

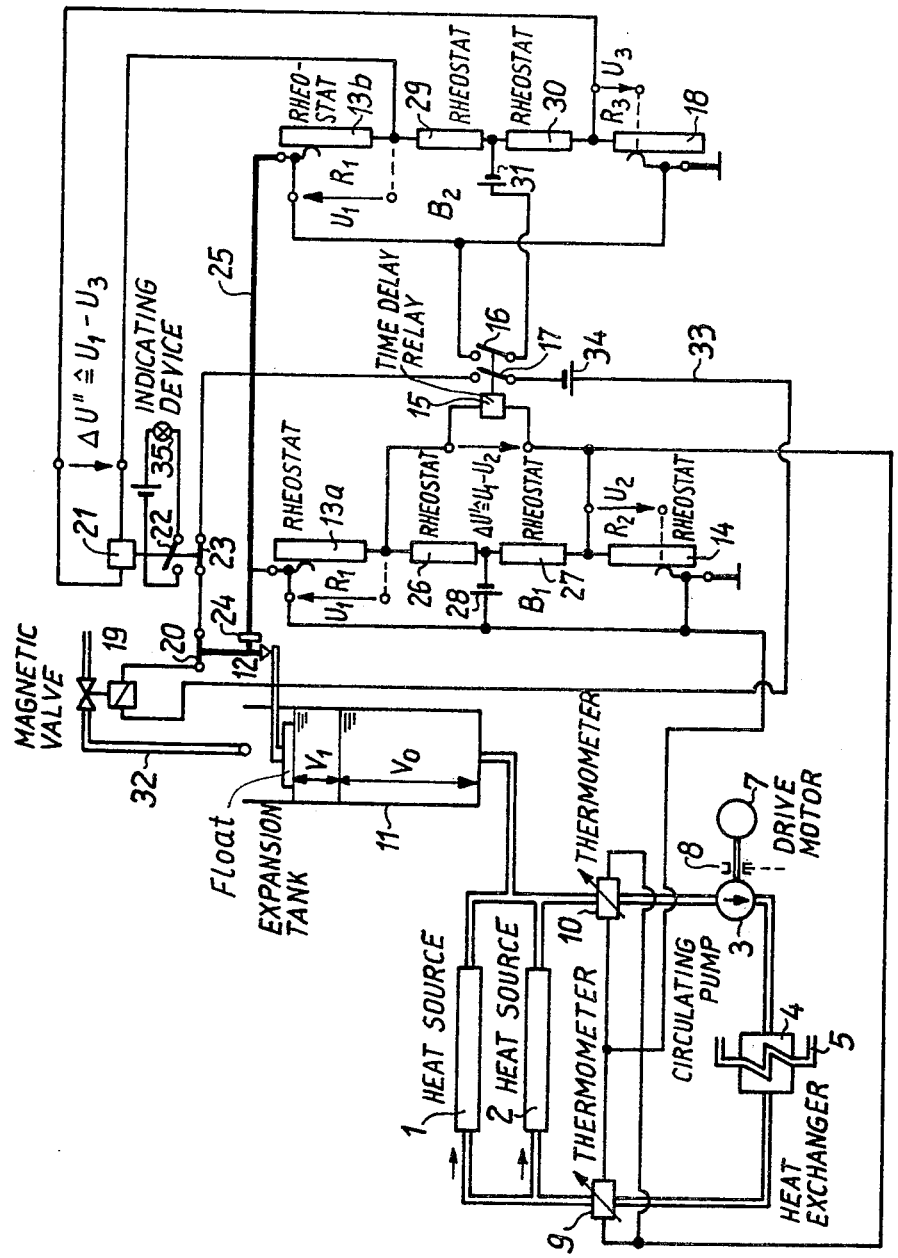

LEAK INDICATING APPARATUS FOR A CLOSED COOLING SYSTEM OF AN ELECTRIC MACHINE

RELATED APPLICATIONS

This application is a continuation-in-part of the application having Ser. No. 431,162 now abandoned and filed Jan. 7, 1974.

BACKGROUND OF THE INVENTION

This invention relates to a leak indicating apparatus for the closed cooling system of an electric machine.

Electric machines of high capacity for example, water power generators, have in recent times been cooled with the aid of a coolant which in most systems is water. The coolant is especially prepared and is circulated in a closed liquid cooling system. Often, there is provided a leak indicating apparatus for detecting undesired losses of coolant because of leaks since such leaks could lead to damage.

A leak indicating apparatus of this type is disclosed in U.S. Pat. No. 3,410,102. In this known apparatus, there are provided transducer elements before and after the parts to be cooled for changing the temperature into an electrical signal. Further, at the highest location of the liquid cooling system, there is provided an expansion tank wherein the liquid level can adjust itself freely and wherein a level measuring device is arranged. This measuring device consists of a floating body arranged in a vertical tube of the expansion tank. The floating body drives a toothed rod in the upward or downward direction according to how the level of the liquid changes. This mechanical operation is initiated by the change of level and is, in turn, translated into an electrical value which corresponds to the level in the expansion tank. This translation is made mechanically with the aid of a toothed wheel which is attached to the movable terminal of a potentiometer, the potentiometer being connected between the plus and minus terminals of a direct current circuit.

Further, between the plus and minus terminals of the direct current circuit, there are provided three series-connected adjustable resistance elements of which two are arranged in front of and behind of the parts of the electric machine which is to be cooled and thereby detect the average temperature and translate the same into an electrical signal since both these resistance elements are wound from a wire material having a resistance value which increases with increasing temperature. In contrast, the third resistance element is essentially independent of the temperature.

The electrical signals indicative of level and temperature changes obtained in the above-described manner are then compared with each other. For this purpose in the known apparatus, the mid-terminal of the temperature-dependent voltage divider and the mid-terminal of the level-dependent voltage divider are connected with each other by means of a relay coil and a diode serially connected with the relay coil. The resistance elements are so adjusted at the normal operating temperature of the electric machine so that the voltage on the relay coil corresponds to zero.

With a change in level in the context of the normal volume-temperature proportionality, the voltage changes on the mid-terminal of the temperature-dependent voltage divider compensate themselves by means of the change of the resistances in front of and behind of the parts to be cooled and, at the midterminal of the level indicating voltage divider by means of a change in level. Therefore, the working contacts of the relay do not close. However, in contrast to the foregoing, if the floating body in the expansion tank should sink because of a leak occurring in the liquid cooling system so that the volume as well as the level no longer corresponds to the normal volume-temperature proportionality, the relay coil is energized and actuates an alarm device with the aid of the working contacts and thereafter, through the working contacts actuates a shutdown mechanism for the electric machine.

The known leak indicating apparatus therefore responds to all volume and level changes corresponding to the non-normal volume-temperature proportionality. This has the disadvantage that the liquid cooling system must be constructed so as to be completely seal-tight, that is, the cooling system may not contain any seals which during operation cause a certain constant coolant loss. Furthermore, the known apparatus requires an available direct current source and individual elements which are precisely matched to each other since direct current potentials must be workable against each other and must be able to be self-compensating.

Siemens-Zeitschrift 1967 discloses a leak indicating apparatus at pages 838 and 839 which also takes into consideration the fact that slide-sealing rings present in the liquid cooling system at rotating machine parts such as pumps have associated therewith a certain coolant loss which must be replaced at definite time intervals. Accordingly, a device for automatically replenishing water is connected to the expansion tank. In the known apparatus, the elevation of the liquid level is detected by means of a level measuring device and this device initiates means for adding replenishing coolant in dependence upon time and level to the expansion tank or it can actuate an indicating device which provides a warning signal. Further, the average temperature of the coolant is measured by means of thermometers which are arranged in back of and in front of the heat exchanger.

In view of the foregoing, it is an object of the invention to provide a leak indicating apparatus which is improved in such a manner that small leaks present in the assembled cooling system with which are associated natural leak losses are not detected by the leak indicating apparatus in the same manner as volume changes caused by temperature changes are not detected.

It is a further object of the invention to provide such a leak indicating apparatus wherein the apparatus can be operated by translating the measured values into electrical signals with direct currents as well as with alternating currents.

SUMMARY OF THE INVENTION

The leak indicating apparatus according to the invention indicates leaks in a closed liquid cooling system of an electric machine. The leak indicating apparatus includes measuring sensors for translating the temperature into electrical signals. These measuring sensors are disposed in front of and behind of the parts to be cooled and detect the average temperature of the cooling liquid. An expansion tank is arranged at the highest location of the liquid cooling system wherein the liquid level can freely adjust itself. Further, the leak indicating apparatus includes a level measuring device as well as an alarm device. The level measuring device influences, according to its position, a first adjustable resistor. The alarm device is actuated by the closing of a contact when there is a deviation from the normal volume-temperature proportionality. For the comparison of the level-dependent signal and of the temperature-dependent signal, there is provided a bridge circuit having a mid-branch containing a relay with two working contacts.

According to a feature of the invention, the above leak indicating apparatus is constructed so that both measuring sensors and an adjustable resistance are connected parallel with each other to form a composite parallel circuit. The mesuring sensors can be in the form of resistance thermometers or thermo elements and are utilized for translating the temperature into electrical signals. The composite parallel circuit constitutes an impedence of the bridge circuit. It is a further feature of the leak indicating apparatus according to the invention that the relay having two working contacts and disposed in the mid-branch of the bridge circuit is a time relay. If the voltage ($U_1$) appearing on the first adjustable resistor of the level measuring device becomes larger than the voltage ($U_2$) appearing on the composite parallel circuit made up of the measuring sensors and the adjustable resistor, then, after the time delay has run out, the time delay relay closes with its first working contact a current circuit with a still further adjustable resistor whose voltage ($U_3$) is a measure of the quantity of cooling liquid lost through fine leaks and which voltage ($U_3$) can be tapped-off.

With the other working contact, the time delay relay actuates, through two normally-closed contacts, a magnetic valve into the open position. The magnetic valve is disposed in the cooling liquid supply line for the expansion tank and the one normally-closed contact is a limit switch for the upper limit value in the level measuring device. The other normally-closed contact is a contact of a further relay which is connected into the mid-branch of a second bridge circuit which is utilized for comparing the voltages ($U_1$) and ($U_3$) on second adjustable resistor of the level measuring device and the above-mentioned still further adjustable resistor, respectively. The working contacts of the further relay initiates a warning signal when the voltage ($U_1$) on the second adjustable resistance of the level measuring device is larger than the voltage ($U_3$) on the further adjustable resistance.

In the leak indicating apparatus according to the invention, the comparison of the individual values translated into electrical quantities is made in the bridge circuits so that the arrangement is independent of the kind of current used. The leak indicating apparatus of the invention further detects each given fine-leak loss whose value corresponding to a definite time interval is adjustable in a simple manner on a slide resistor. This time interval corresponds to the time delay of the relay which either actuates the indicating device or opens a magnetic valve for supplying replenishing cooling liquid. This value of the fine-leak loss is likewise considered in the comparison of the electrical quantities with each other so that in the liquid cooling system, shaft seals can be installed which operate in the mixed-friction region in order to keep the ruboff at the sealing surfaces as small as possible. Further, a simple adaptability of the leak indicating apparatus to the existing volume-temperature proportionality is obtained during assembly because this adaption is undertaken in the circuit of the temperature detection by means of a simple adaption of the resistance value of an adjustable resistor so that a position change of the level indicating device is not necessary.

Although the invention is illustrated and described herein as a leak indicating apparatus for a closed cooling system of an electric machine, it is nevertheless not intended to be limited to the details shown, since various modifications may be made therein within the scope and the range of the claims. The invention, however, together with additional objects and advantages will be best understood from the following description and in connection with the accompanying drawing.

BRIEF DESCRIPTION OF THE DRAWING

The drawing is a mechanical and an electrical schematic diagram showing the leak indicating apparatus according to the invention as it is arranged with respect to the principal parts of the closed cooling liquid circuit of an electric machine.

DESCRIPTION OF THE PREFERRED EMBODIMENTS OF THE INVENTION

The heat sources 1 and 2 existing in an electrical machine such as the stator and rotor windings are arranged so that treated water can flow therethrough, the treated water serving as a coolant. In flowing through the machine, the coolant takes up a certain quantity of heat. The coolant then flows in forced circulation through one or more circulating pumps 3 and gives up its heat in the heat exchanger 4 to a secondary cooling stream 5. The circulating pumps provided in the coolant system are connected with suitable couplings to a drive motor 7. Each circulating pump 3 contains a shaft seal 8 which operates in the mixed-friction region in order to hold the rub-off at the sealing surfaces as small as possible. The mixed friction requires the presence of a grease gap between the sealing surfaces whereat a fine-leak loss occurs from the total coolant quantity.

Since the heat sources 1 and 2 have different temperatures for different operating conditions of the electric machine as for example no load or full load, there is a corresponding change in the quantity of heat taken up by the coolant and therefore the average temperature of the coolant changes also. In order to measure this, temperature sensing means including measuring sensors 9 and 10 are provided. The measuring sensors 9 and 10 are arranged in front of and in back of the heat exchanger 4. Electric resistance thermometers are suitable for use as such measuring sensors. Furthermore, the expansion tank 11 is disposed in the coolant circulation system 6 wherein a certain supply quantity of coolant $V_o$ is available. This expansion tank 11 with its freely adjustable liquid level takes up the volume expansion of the entire quantity of coolant in the cooling system 6 in response to temperature changes. The liquid level present in the expansion tank 11 is detected by means of the level measuring device. The level measuring device includes operating means for mechanically actuating the sliding contact of a adjustable resistor means. The operating means can include a level detector 12 which mechanically actuates the adjustable resistors 13a and 13b with aid of a coupling 24 and a rod 25. The adjustable resistance means is made up of two identical first and second adjustable resistors 13a and 13b. When the volume changes in the expansion tank 11 by an amount $V_1$, the resistance value $R_1$ on the adjustable identical resistors 13a and 13b is changed because of a corresponding level change. Correspondingly, the voltage drop ($U_1$) appearing at this first resistance means 13 is likewise changed. The identical voltage drop ($U_1$) can be taken off of each of the two identical resistors 13a and 13b.

The voltage ($U_1$) taken off of the resistor 13a is compared in a first bridge circuit $B_1$ with a voltage ($U_2$) corresponding to the average temperature of the coolant. The voltage ($U_2$) can be taken off of a third adjustable resistor 14. The measuring sensors 9 and 10 connected in parallel are in parallel with the resistor 14. The third resistor 14 is constructed in the form of a sliding resistor for example and its adjustability has the advantage that the voltages ($U_1$) and ($U_2$) can be adjusted to each other in correspondence to the volume-temperature proportionality during the assembly of the leak indicating apparatus without it being necessary that the level detector 12 has to be changed with regard to its position. The first bridge circuit $B_1$ also includes the resistors 26, 27 and the voltage source 28.

So long as the volume in the expansion tank changes only as a result of temperature changes in the coolant, the current flowing in the electric-resistance thermometer circuit changes also and as a result thereof, also the voltage drop ($U_2$). The corresponding level change and therewith the voltage drop ($U_1$) and the voltage drop ($U_2$) are linearly dependent upon the temperature change. Then in the bridge circuit, no balancing current flows and the leak indicating apparatus does not become operative.

In contrast to the foregoing, should the voltage drop ($U_1$) become greater than ($U_2$) or, stated otherwise, should there occur a change in level without a corresponding change in temperature, the balance current flowing in the bridge switches a time-delay actuator in the form of a time relay 15 on. The time relay 15 has a definite delay time of say twenty four hours. The balance current is produced by the voltage: $\Delta U' = U_1 - U_2$. The time relay 15 is disposed in the mid-branch of the bridge circuit $B_1$ and has two electrical working contacts 16 and 17 of which the working contact 16 serves to close the current circuit in which adjustable means in the form of a fourth adjustable resistor 18 is arranged. The resistor 18 has a resistance value $R_3$ which is so adjusted that the voltage ($U_3$) appearing thereon is a measure for the fine-leak loss quantity permissible in a time interval of the time delay $t$, that is, a value for the leak loss at the rotating slide ring seals. This voltage ($U_3$) is likewise compared to the voltage ($U_1$) taken off of the resistor 13b in a second bridge circuit $B_2$ in order to obtain the difference voltage: $\Delta U'' = U_1 - U_3$.

In addition to the adjustable resistors 13b and 18, the bridge circuit $B_2$ also contains the resistors 29 and 30 and the voltage source 31. Since the voltages detected in the bridge circuits $B_1$ and $B_2$ are always very small, it is necessary that the voltage sources 28 and 31 be constant and not be subjected to any voltage fluctuations.

If the time relay 15 is actuated after a volume change occurs in the expansion tank 11 which deviates from the normal volume-temperature proportionality because a difference voltage $\Delta U'$ occurs, the working contacts 16 and 17 of the time relay 15 close after a time $t$. In this way, replenishing coolant is supplied to the expansion tank 11 through the conduit 31 by means of the opening of a magnetic valve 19 arranged in valve circuit 33. However, at the same time a comparison between the voltages ($U_1$) and ($U_3$) is made in the bridge circuit $B_2$. If the determined temperature-independent volume difference lies below the permissible fine-loss leak quantity, then $U_1$ is smaller or equal to $U_3$. When $U_1$ is smaller or the same as $U_3$, the leak replenishment occurs automatically until the normally-closed contact 20 interrupts the valve circuit 33 and the leak replenishment is ended by the closing of the magnetic valve 19. The normally-closed contact 20 is arranged with respect to the level detector and serves as a limit switch for the upper limit value on the level detector 12. The valve circuit 33 includes the magnetic valve 19, the normally-closed contacts 20 and 23 as well as a voltage source 34.

If $U_1$ is greater then $U_3$, the balance current corresponding to $\Delta U'' = U_1 - U_3$ and flowing in the mid-branch of the second bridge circuit $B_2$ actuates actuation means in the form of the relay 21 of the indicating device 35 which initiates a warning signal by closing the contact 22. With the closing of relay 21, the normally-closed contact 23 is opened and therewith likewise the current circuit 33 to the magnetic valve 19 is interrupted whereby a further supply of replenishing coolant into the expansion tank 11 is cut off. The normally-closed contact 23 is connected with the working contact 22 as shown in the drawing.

By means of the first and second bridge circuits $B_1$ and $B_2$, the improved leak indicating apparatus according to the invention considers both the normal volume change resulting from temperature changes as well as the permissible fine-loss leak quantities determined by the construction of the cooling system 6 so that an alarm signal is given off by the indicating device 35 only when actual additional leaks occur within the cooling system 6. Since all measurement quantities, which here come into question, are converted into electrical quantities which are first compared with each other in a bridge circuit, the leak indicating apparatus according to the invention affords the advantage of providing greater accuracy and simple construction. Since the leak indicating device does however include a time relay 15 with a definite time $t$, it is applicable only for detecting relatively small leaks. Therefore, there must in addition be protection provided in the cooling system 6 against a sudden coolant loss for example where a conduit bursts which then will cause the machine to shut down immediately. Apparatus for providing such protection is known for coolant cooled machines.

What is claimed is:

1. Leak indicating apparatus for the closed liquid coolant circulation circuit for cooling parts of an electrical machine, the liquid coolant changing in volume with changes in temperature in correspondence to a predetermined temperature-volume proportionality, the circulation circuit having an expansion tank wherein the level of the coolant can freely change and a circulation pump having rotating parts with slide ring seals through which the coolant may leak, the expansion tank being disposed at the highest elevation of the circulation circuit, and a coolant supply line for supplying replenishing coolant to the expansion tank, the leak indicating apparatus comprising:

a level measuring device including: level sensing means for monitoring the level of the coolant in the expansion tank and for providing a level-dependent electrical signal indicative of the level of said coolant in said expansion tank;

alarm circuit means for providing a warning signal when there is a deviation from the normal volume-temperature proportionality;

temperature sensing means for detecting the average temperature of the coolant and for translating said average temperature into a temperature-dependent electrical signal;

first comparison circuit means for comparing said level-dependent signal with said temperature-dependent signal;

adjustable means for providing a fine-leak loss signal indicative of the fine-leak quantity permissible in a given time interval;

second comparison circuit means for comparing said level-dependent signal to said fine-leak loss signal;

a time-delay actuator having first and second working contacts and having a time delay corresponding to said time interval, said time-delay actuator being connected to said first comparison means for becoming energized when said level-dependent electrical signal is greater than said temperature-dependent electrical signal thereby actuating said working contacts after said time delay has run out, said first working contact being connected into said second comparison circuit means for energizing the same when said first working contact is actuated;

a valve circuit including: an electromagnetic valve disposed in the coolant supply line for opening and closing said line, and a normally-closed contact;

said second working contact of said time-delay actuator being connected into said valve circuit for closing said valve circuit through said normally-closed contact for energizing said valve to open said supply line when said second working contact is actuated;

said level measuring device further including: means for actuating said normally-closed contact when the level of coolant in said expansion tank has reached an upper limit value; and, actuation means having a working contact and being connected to said second comparison circuit means for becoming energized when said level-dependent signal is greater than said fine-loss signal thereby actuating said last-mentioned working contact, said contact of said actuation means being connected into said alarm circuit means for energizing the same when said actuation means becomes energized whereby said warning signal is provided.

2. The leak indicating apparatus of claim 1, said valve circuit including an additional normally-closed contact through which said valve is energized when said second working contact of said time-delay actuator is actuated, said actuation means having an additional working contact actuable when said actuation means is energized, said additional working contact being said additional normally-closed contact of said valve circuit whereby said valve circuit is opened when said actuation means is energized thereby closing said valve.

3. The leak indicating apparatus of claim 1, said level sensing means including: first and second adjustable resistors; operating means connected to said first and second adjustable resistors for varying the resistances thereof in correspondence to the level of the coolant in said expansion tank whereby a voltage dropped across each of said resistors corresponds to said level-dependent electrical signal; said temperature sensing means including: measuring sensors disposed in front of and behind of the machine parts to be cooled; and, a third adjustable resistor connected in parallel to each of said measuring sensors to form a composite parallel circuit whereby a voltage dropped across said composite parallel circuit corresponds to said temperature-dependent electrical signal; said first comparison means being a first bridge circuit, said composite parallel circuit being an arm of said bridge circuit, said first adjustable resistor being another arm of said bridge circuit, said time-delay actuator being a time-delay relay constituting the load impedance of said bridge circuit, said time-delay relay being configured to become energized when said voltage across said first adjustable resistor is greater than said voltage across said composite parallel circuit; said adjustable means being a fourth adjustable resistor adjustable so that a voltage dropped across the same corresponds to said fine-leak loss signal; said second comparison means being a second bridge circuit, said fourth adjustable resistor being an arm of said second bridge circuit, said second adjustable resistor being another arm of said second bridge circuit, said actuation means being a further relay constituting the load impedance of said second bridge ciruit, said further relay being configured to become energized when said voltage across said second adjustable resistor is greater than said voltage across said fourth adjustable resistor.

4. The leak indicating apparatus of claim 3, said valve circuit including an additional normally-closed contact through which said valve is energized when said second working contact of said time-delay relay is actuated, said further relay having an additional working contact actuable when said further relay is energized, said additional working contact being said additional normally-closed contact of said valve circuit whereby said valve circuit is opened when said further relay is energized thereby closing said valve.

5. The leak indicating apparatus of claim 3, each of said measuring sensors being a resistance thermometer.

6. The leak indicating apparatus of claim 3, each of said measuring sensors being a thermoelement.

* * * * *